United States Patent [19]
Sassa et al.

[11] Patent Number: 5,753,939
[45] Date of Patent: May 19, 1998

[54] LIGHT-EMITTING SEMICONDUCTOR DEVICE USING A GROUP III NITRIDE COMPOUND AND HAVING A CONTACT LAYER UPON WHICH AN ELECTRODE IS FORMED

[76] Inventors: Michinari Sassa, 57, Morinakamichi, Jimokuji-cho, Ama-gun, Aichi-ken, 490-11; Naoki Shibata, 76-102, Kayaba, Nakajima, Konobu, Bisai-shi, Aichi-ken, 494; Shinya Asami, 80-2-203, Takahata, Ochiai, Haruhi-cho, Nishikasugai-gun, Aichi-ken, 452; Masayoshi Koike, 86-B103, Jizoe, Myokoji, Yamato-cho, Ichinomiya-shi, Aichi-ken, 491; Junichi Umezaki, 31-20, Mukaiura, Haguro, Inuyama-shi, Aichi-ken, 484; Takahiro Kozawa, 2-3-9-201, Yoshioka-cho, Owariasahi-shi, Aichi-ken, 488, all of Japan

[21] Appl. No.: 813,393

[22] Filed: Mar. 7, 1997

Related U.S. Application Data

[63] Continuation of Ser. No. 531,373, Sep. 20, 1995, abandoned.

[30] Foreign Application Priority Data

Sep. 20, 1994 [JP] Japan .................... 6-252896

[51] Int. Cl.$^6$ ........................................ H01L 33/00
[52] U.S. Cl. .................. 257/94; 257/96; 257/101; 257/102; 257/103
[58] Field of Search ............... 257/13, 94, 96, 257/99, 101, 102, 103; 372/45, 46

[56] References Cited

U.S. PATENT DOCUMENTS 5,247,533  9/1993  Okazaki et al. ............... 372/45
5,408,120  4/1995  Manabe et al. ............... 257/102

FOREIGN PATENT DOCUMENTS

| 0599224 | 6/1994 | European Pat. Off. ............... 257/103 |
| 0 675 552 A1 | 3/1995 | European Pat. Off. ............... 257/103 |
| 2-229475 | 9/1990 | Japan . |
| 5-243614 | 9/1993 | Japan . |
| 5308156 | 11/1993 | Japan ............................ 257/103 |
| 6-151964 | 5/1994 | Japan . |
| 6151968 | 5/1994 | Japan . |
| 6232451 | 8/1994 | Japan . |
| 62-68259 | 9/1994 | Japan . |

OTHER PUBLICATIONS

Nakamura et al., "Candela-class High-brightness InGaN/AlGaN Double-heterostructure Blue-light-emitting Diodes", Applied Physics Letters, Mar. 28, 1994, vol. 64, No. 13, pp., 1687–1689.

Primary Examiner—Minh-Loan Tran

[57] ABSTRACT

A light-emitting semiconductor device having an improved metal electrode and semiconductor structure that lowers the driving voltage of the device. The device has a hetero p-n junction structure. This structure includes: (1) an n-layer having n-type conduction and a Group III nitride compound semiconductor satisfying the formula $Al_xGa_yIn_{1-x-y}N$, inclusive of x=0, y=0, and x=y=0; (2) a p-layer having p-type conduction and a Group III nitride compound semiconductor satisfying the formula $Al_xGa_yIn_{1-x-y}N$, inclusive of x=0, y=0, and x=y=0; and (3) an emission layer disposed between the n-layer and the p-layer. The device also has a metal electrode and a contact layer that is disposed between the p-layer and the metal electrode. The contact layer is doped with an acceptor impurity more heavily that is the p-layer. The acceptor impurity may be magnesium (Mg). The contact layer may be doped within the range of $1\times10^{20}/cm^3$ to $1\times10^{21}/cm^3$ and may comprise a first and a second contact layer.

32 Claims, 8 Drawing Sheets

LIGHT-EMITTING SEMICONDUCTOR DEVICE USING A GROUP III NITRIDE COMPOUND AND HAVING A CONTACT LAYER UPON WHICH AN ELECTRODE IS FORMED

This is a continuation of application Ser. No. 08/531,373, filed on Sep. 20, 1995, which was abandoned.

BACKGROUND OF THE INVENTION

1. Field of the Invention

The present invention relates to a light-emitting semiconductor device that uses a Group III nitride compound, and, more particularly, to an LED having an improved metal-to-semiconductor contact.

2. Description of the Related Art

It has been known that an aluminum gallium indium nitride (AlGaInN) compound semiconductor may be used to obtain a light-emitting diode (LED) that emits blue light. This semiconductor device is useful because of its high luminous efficiency resulting from direct electron transition and because of its ability to emit blue light, which is one of the three primary colors.

Irradiating an electron beam into or heat treatment of a magnesium (Mg) doped i-layer alters it to exhibit p-type conduction. As a result an LED with a double hetero p-n junction structure made of an aluminum gallium nitride (AlGaN) p-layer, a zinc (Zn) doped indium gallium nitride (InGaN) emission layer, and an AlGaN n-layer is preferable when compared to a conventional LED of metal insulator semiconductor (MIS) structure that includes an n-layer and a semi-insulating i-layer.

The conventional LED with a double hetero p-n junction structure utilizes a GaN layer doped with Mg on the order of $10^{19}/cm^3$ as a contact layer for the p-layer. The contact layer has a high carrier concentration of $7 \times 10^{17}/cm^3$ and a high efficiency in hole injection. The inventors of the present invention found for the first time that the GaN contact layer prevents a decrease in the driving voltage because of the Schottky barrier at the metal semiconductor electrode interface.

SUMMARY OF THE INVENTION

It is, therefore, an object of the present invention to lower the driving voltage of an LED without diminishing the hole injection efficiency by forming a new LED structure which provides excellent ohmic contact to the metal electrodes of the device.

According to the first aspect of the invention, there is provided a light-emitting semiconductor device comprising:

an n-layer with n-type conduction made of a Group III nitride compound semiconductor satisfying the formula $Al_xGa_yIn_{1-x-y}N$, inclusive of $x=0$, $y=0$, and $x=y=0$;

a p-layer with p-type conduction made of a Group III nitride compound semiconductor satisfying the formula $Al_xGa_yIn_{1-x-y}N$, inclusive of $x=0$, $y=0$, and $x=y=0$;

a contact layer for the p-layer that directly contacts a metal electrode; and wherein the contact layer is doped more heavily than the p-layer with an acceptor impurity.

According to the second aspect of the invention, Mg is used as an acceptor.

According to the third aspect of the invention, the contact layer has p-type conduction and is doped with magnesium (Mg) in the range of $1 \times 10^{20}/cm^3$ to $1 \times 10^{21}/cm^3$.

According to the fourth aspect of the invention, the contact layer has p-type conducting directly contacts the metal electrode, and is doped with magnesium (Mg) in the range of $1 \times 10^{20}/cm^3$ to $1 \times 10^{21}/cm^3$.

According to the fifth aspect of the invention, the contact layer has a double p-layer structure comprising by a first contact layer that has p-type conduction, is doped with magnesium (Mg) in the range of $1 \times 10^{20}/cm^3$ to $1 \times 10^{21}/cm^3$ range, and directly contacts the metal electrode, and a second contact layer that is doped with magnesium (Mg) in the range of $1 \times 10^{19}/cm^3$ to $5 \times 10^{20}/cm^3$.

According to the sixth aspect of the invention, the contact layer exhibits p-type conduction is doped with magnesium (Mg) in the range of $1 \times 10^{20}/cm^3$ to $1 \times 10^{21}/cm^3$, and is in direct contact with the metal electrode. In addition, the p-layer that contacts the contact layer is doped with magnesium (Mg) in the range of $1 \times 10^{19}/cm^3$ to $5 \times 10^{20}/cm^3$.

According to the seventh aspect of the invention, the contact layer is made of gallium nitride (GaN) and the metal electrode is made of nickel (Ni) or an alloy of Ni.

As described above, doping an acceptor impurity more heavily into the contact layer that directly contacts the metal electrode provides better ohmic characteristic to the metal electrode. As a result, the driving voltage of the device can be lowered to 4 V.

When Mg is used as an acceptor impurity, the preferable concentration of the acceptor is in the range of $1 \times 10^{20}/cm^3$ to $1 \times 10^{21}/cm^3$. A Mg-doped first contact layer in this range that exhibits p-type conduction and that directly contact a metal electrode can improve ohmic characteristic but lowers the hole concentration in the layer. In order to prevent decrease in hole concentration, another layer is provided just below the Mg doped first contact layer as a second contact layer or a p-layer. The second contact layer or the p-layer is doped with Mg more lightly than the Mg-doped first contact layer in the range of $1 \times 10^{19}/cm^3$ to $5 \times 10^{20}/cm^3$. As a result, the hole concentration of the second contact layer or the p-layer is increased to prevent a decrease in luminous efficiency.

Other objects, features, and characteristics of the present invention will become apparent upon consideration of the following description, the appended claims and with reference to the accompanying drawings, all of which form a part of the specification, and wherein referenced numerals designate corresponding parts in the various figures.

DETAILED DESCRIPTION OF EXEMPLARY EMBODIMENTS

The invention will be more fully understood by reference to the following examples.

EXAMPLE 1

Figure 1:
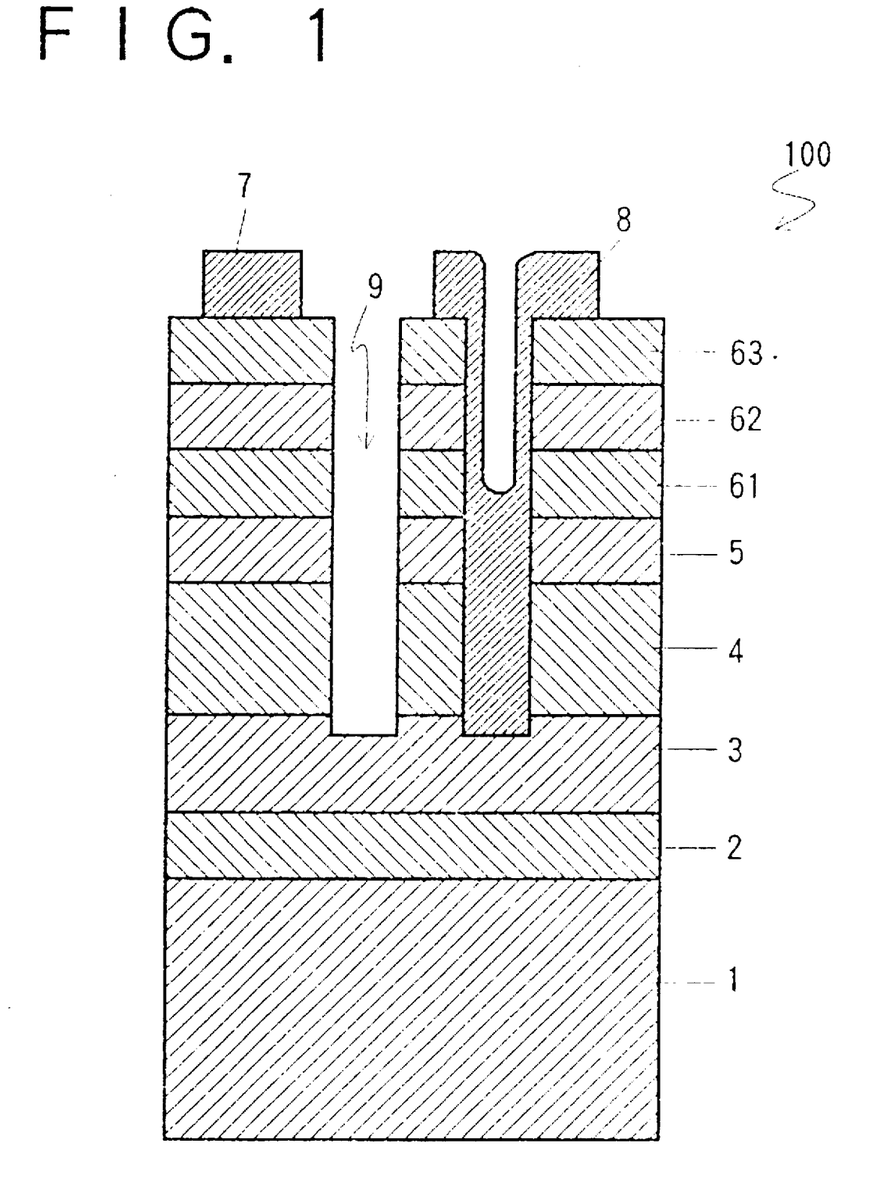
FIG. 1 is a diagram showing the structure of the LED in Example 1.

FIG. 1 shows an LED 100 embodied in Example 1. It has a sapphire ($Al_2O_3$) substrate 1 upon which the following seven layers are consecutively formed: an AlN buffer layer 2; a silicon (Si) doped GaN n-layer 3 of high carrier (n-type) concentration; a Si-doped $(Al_{x2}Ga_{1-x2})_{y2}In_{1-y2}N$ n$^+$-layer 4 of high carrier (n-type) concentration; magnesium (Mg), cadmium (Cd), and Si-doped $(Al_{x1}Ga_{1-x1})_{y1}In_{1-y1}N$ p-type emission layer 5; a Mg-doped $(Al_{x2}Ga_{1-x2})_{y2}In_{1-y2}N$ p-layer 61; a Mg-doped GaN second contact layer 62; and a Mg-doped GaN first contact layer 63. The AlN layer 2 has a thickness of 500 Å. The n$^+$-layer 3 is about 2.0 μm in thickness and has a $2\times10^{18}/cm^3$ electron concentration. The n$^+$-layer 4 is about 2.0 μm in thickness and has a $2\times10^{18}/cm^3$ electron concentration. The emission layer 5 has about a 0.5 μm thickness. The p-layer 61 has about 1.0 μm thickness, a $5\times10^{17}/cm^3$ hole concentration, and a $1\times10^{20}/cm^3$ Mg concentration. The second contact layer 62 has about 0.2 μm thickness, a $5\times10^{17}/cm^3$ hole concentration, and a $1\times10^{20}/cm^3$ Mg concentration. The first contact layer 63 has a 500 Å thickness, a $2\times10^{17}/cm^3$ hole concentration, and a $2\times10^{20}/cm^3$ Mg concentration. Nickel electrodes 7 and 8 are connected to the first contact layer 63 and the n$^+$-layer 4, respectively. The electrodes 7 and 8 are electrically insulated from one another by a groove 9.

The LED 100 is produced by gaseous phase epitaxial growth, called metal organic vapor phase epitaxy (referred to as MOVPE hereinafter).

The gases employed in this process are ammonia ($NH_3$), a carrier gas ($H_2$ or $N_2$), trimethyl gallium ($Ga(CH_3)_3$) (TMG hereinafter), trimethyl aluminum ($Al(CH_3)_3$) (TMA hereinafter), trimethyl indium ($In(CH_3)_3$) (TMI hereinafter), dimethylcadmium (($Cd(CH_3)_2$) (DMCd hereinafter), silane ($SiH_4$), and biscyclopentadienyl magnesium ($Mg(C_5H_5)_2$) ($CP_2Mg$ hereinafter).

The single crystalline sapphire substrate 1, whose main surface 'a' was cleaned by an organic washing solvent and heat treatment, was placed on a susceptor in a reaction chamber for the MOVPE treatment. Then the sapphire substrate 1 was etched at 1100° C. by a vapor of $H_2$ fed into the chamber at a flow rate of 2 liter/min. under normal pressure for a period of 5 min.

On the etched sapphire substrate 1, a 500 Å thick AlN buffer layer 2 was formed on the surface 'a' under conditions of lowering the temperature in the chamber to 400° C., keeping the temperature constant, and supplying $H_2$ at a flow rate of 20 liter/min., $NH_3$ at 10 liter/min., and TMA at $1.8\times10^{-5}$ mol/min. for a period of about 90 sec. On the buffer layer 2, about a 2.0 μm thick Si-doped GaN n$^+$-layer 3 of high carrier concentration with an electron concentration of about $2\times10^{18}/cm^3$ was formed under conditions of keeping the temperature of the sapphire substrate 1 at 1150° C. and supplying $H_2$ at a flow rate of 20 liter/min., $NH_3$ at 10 liter/min., TMG at $1.7\times10^{-4}$ mol/min., and diluted silane to 0.86 ppm by $H_2$ at 200 ml/min. for 30 minutes, respectively.

The following manufacturing process provides for an emission layer 5 as an active layer, an n$^+$-layer 4 of high carrier concentration and a p-layer 61 as clad layers; the LED 100 is designed to emit at a 430 nm wavelength peak in the luminous spectrum and has luminous centers of Cd and Si.

On the n$^+$-layer 3, about a 2.0 μm thick Si-doped $(Al_{0.47}Ga_{0.53})_{0.9}In_{0.1}N$ n$^+$-layer 4 of high carrier concentration with an electron concentration of $1\times10^{18}/cm^3$ was formed under conditions of keeping the temperature of the sapphire substrate 1 at 850° C. and supplying $N_2$ or $H_2$ at a flow rate of 10 liter/min., $NH_3$ at 10 liter/min., TMG at $1.12\times10^{-4}$ mol/min., TMA at $0.47\times10^{-4}$ mol/min., TMI at $0.1\times10^{-4}$ mol/min., and diluted silane to 0.86 ppm by $H_2$ at $1\times10^{-8}$ mol/min. for 60 min.

On the n$^+$-layer 4, about a 0.5 μm thick Mg-, Cd-, and Si-doped $(Al_{0.3}Ga_{0.7})_{0.94}In_{0.06}N$ emission layer 5 was formed under conditions of keeping the temperature of the sapphire substrate 1 at 850° C. and supplying $N_2$ or $H_2$ at a flow rate of 20 liter/min., $NH_3$ at 10 liter/min., TMG at $1.53\times10^{-4}$ mol/min., TMA at $0.47\times10^{-4}$ mol/min., TMI at $0.02\times10^{-4}$ mol/min., $CP_2Mg$ at $2\times10^{-4}$ mol/min., DMCd at $2\times10^{31\ 7}$ mol/min., and diluted silane to 0.86 ppm by $H_2$ at $1\times10^{-8}$ mol/min. for 60 min. At this stage, the layer 5 exhibited high resistivity. The impurity concentrations of Mg, Cd, and Si doped into the emission layer 5 were $1\times10^{19}/cm^3$, $5\times10^{18}/cm^3$, and $1\times10^{18}/cm^3$, respectively.

On the emission layer 5, about a 1.0 μm thick Mg-doped $(Al_{0.47}Ga_{0.53})_{0.9}In_{0.1}N$ p-layer 61 was formed under conditions of keeping the temperature of the sapphire substrate 1 at 1100° C. and supplying $N_2$ or $H_2$ at a flow rate of 20 liter/min., $NH_3$ at 10 liter/min., TMG at $1.12\times10^{-4}$ mol/min., TMA at $0.47\times10^{-4}$ mol/min., TMI at $0.1\times10^{-4}$ mol/min., and $CP_2Mg$ at $2\times10^{-4}$ mol/min. for 120 min. Resistivity of the p-layer 61 was $10^8$ Ω·cm or more, thus, exhibiting insulative characteristics. The impurity concentration of Mg doped into the p-layer 61 was $1\times10^{20}/cm^3$.

On the p-layer 61, about a 0.2 μm thick Mg-doped GaN second contact layer 62 was formed under conditions of keeping the temperature of the sapphire substrate 1 at 850° C. and supplying $N_2$ or $H_2$ at a flow rate of 20 liter/min., $NH_3$ at 10 liter/min., TMG at $1.12\times10^{-4}$ mol/min., and $CP_2Mg$ at $2\times10^{-4}$ mol/min. for 30 min. Resistivity of the second contact layer 62 was $10^8$ Ω·cm or more exhibiting insulative characteristics. The impurity concentration of Mg doped into the second contact layer 62 was $1\times10^{20}/cm^3$.

On the second contact layer 62, about a 500 Å thick Mg-doped first contact layer 63 was formed under conditions of keeping the temperature of the sapphire substrate 1 at 850° C. and supplying $N_2$ or $H_2$ at a flow rate of 20 liter/min., $NH_3$ at 10 liter/min., TMG at $1.12\times10^{-4}$ mol/min., and $CP_2Mg$ at $4\times10^{31\ 4}$ mol/min. for 10 min. Resistivity of the first contact layer 63 was $10^8$ Ω·cm or more exhibiting insulative characteristics. The impurity concentration of Mg doped into the first contact layer 63 was $2\times10^{20}/cm^3$.

Figure 2:
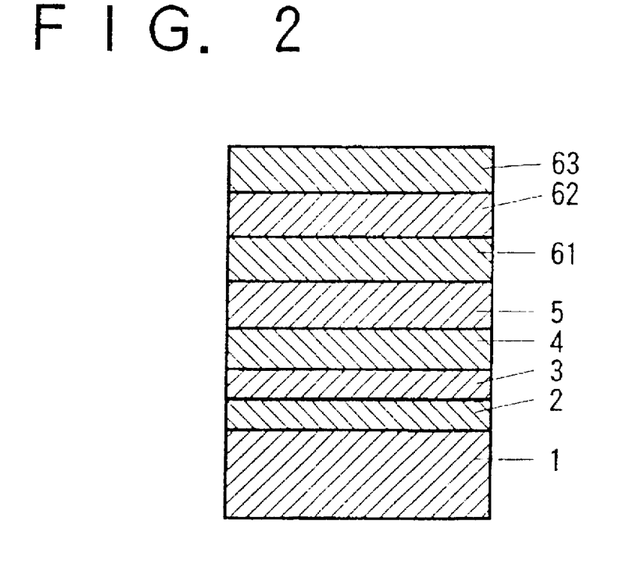
FIGS. 2 through 7 are sectional views illustrating successive steps of producing the LED in Example 1.

Then, electron rays were uniformly irradiated into the first contact layer 63, the second contact layer 62, the p-layer 61, and the emission layer 5 using a reflective electron beam diffraction device. The irradiation conditions were set at about 10 KV for the accelerating voltage, 1 μA for the sample current, 0.2 mm/sec. for the speed of the beam scanning, 60 μmφ for the beam aperture, and at $5.0\times10^{-5}$ Torr vacuum. This irradiation changed the insulative first contact layer 63, second contact layer 62, p-layer 61, and emission layer 5 into a p-type conductive semiconductor with a hole concentration of $2\times10^{17}/cm^3$, $5\times10^{17}/cm^3$, $5\times10^{17}/cm^3$, and $5\times10^{17}/cm^3$ and a resistivity of 2 Ω·cm, 0.8 Ω·cm, 0.8 Ω·cm, and 0.8 Ω·cm, respectively. Thereby, a wafer with multi-layer structure was obtained as shown in FIG. 2.

FIGS. 3 to 7 show sectional views of the formations of an individual device on the wafer. In actual practice and in accordance with industry custom, a wafer with a large number of elements thereon is treated by the following process and divided or diced into individual devices.

Figure 3:
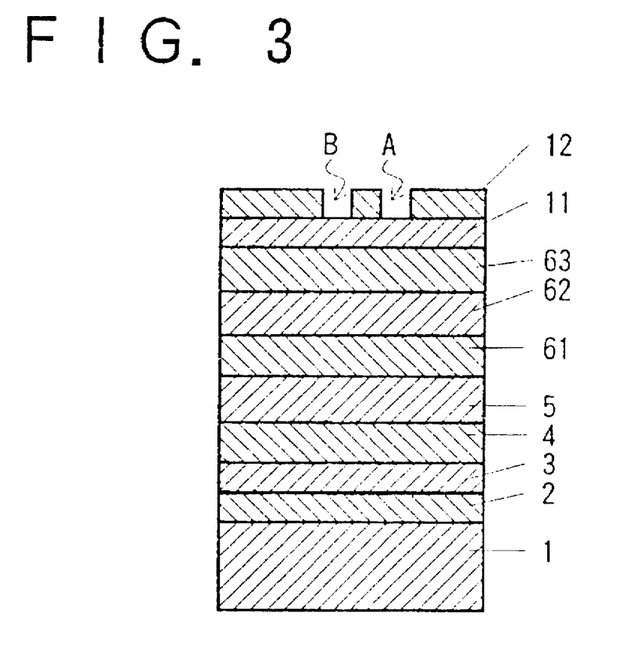

A 2000 Å thick $SiO_2$ layer 11 was formed on the first contact layer 63 by sputtering. Then, the layer 11 was coated with a photoresist layer 12. Two selected parts or areas of the photoresist layer 12, designated as A and B, were removed by photolithography as shown in FIG. 3. The part or area A is an electrode-forming aperture corresponding to where a hole 15, shown in FIG. 5, which is formed extending to and into the n⁻-layer 4 of high carrier concentration. The part or area B corresponds to a trench like isolation groove 9, shown in FIGS. 5 and 6, which is formed for insulating or electrically insulating the part or area A from an electrode in contact with the p-layer 61.

Figure 4:
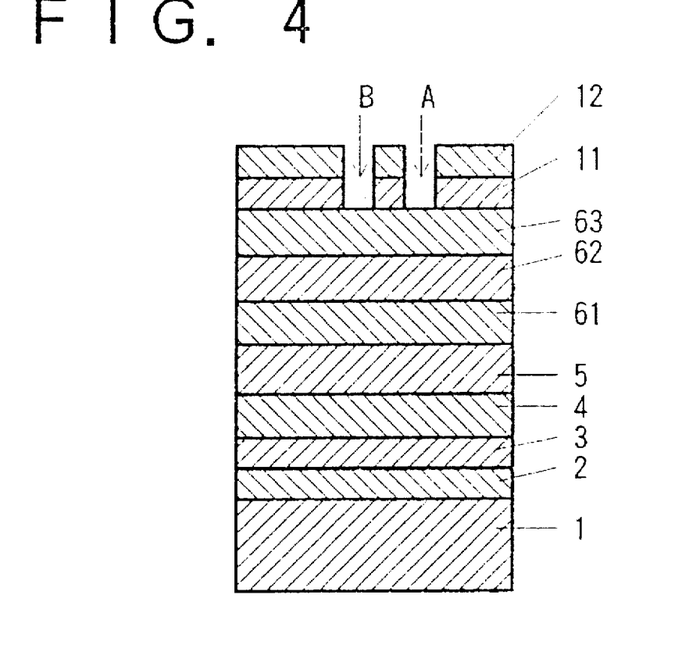
Figure 5:
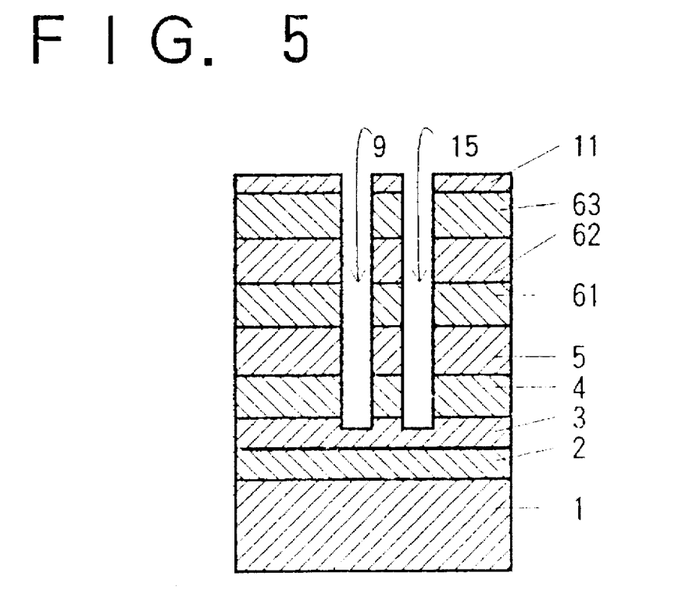

As shown in FIG. 4, two parts of the $SiO_2$ layer 11 which were not covered with the photoresist layer 12 were etched off by an etching liquid such as hydrofluoric acid. Then, the exposed part of the successive layers from the surface of the device, the first contact layer 63 to the emission layer 5, and the upper part of the n⁺-layer 4 of high carrier concentration, were removed by dry etching, by supplying a high frequency power of 0.44 W/cm² and $BCl_3$ gas of 10 ml/min. at a vacuum degree of 0.04 Torr as shown in FIG. 5. After that, dry etching with argon (Ar) was carried out on the device. Consequently, a hole 15 for forming an electrode extending into the n⁺-layer 4 of high carrier concentration and a trench-like groove 9 for insulation purposes are formed.

Figure 6:
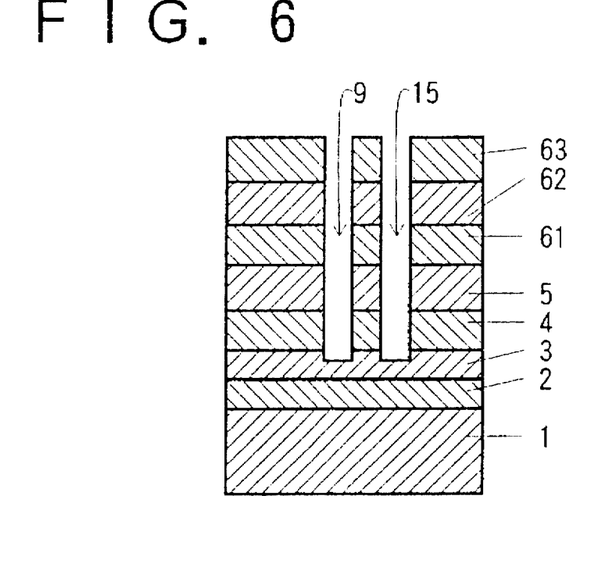
Figure 7:
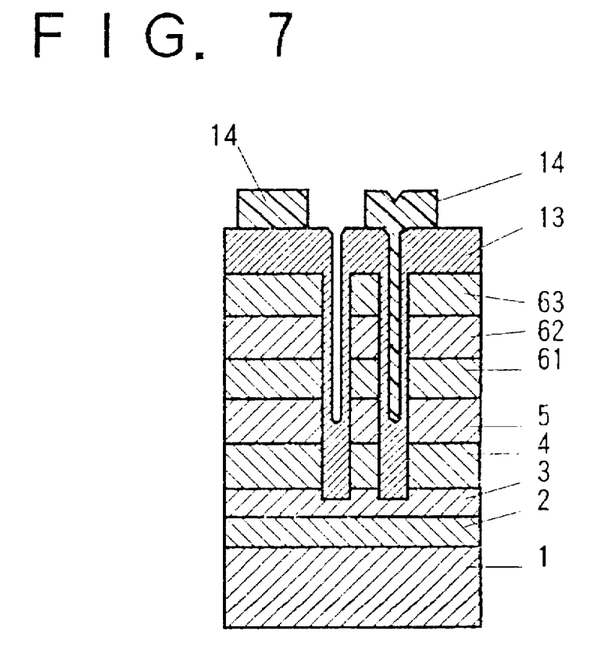

The $SiO_2$ layer 11 remaining on the GaN p-layer 63 was removed by hydrofluoric acid as shown in FIG. 6. A nickel (Ni) layer 13 was laminated on the entire surface of the device by vapor deposition (FIG. 7). Thus, the so-formed Ni layer 13 in the hole 15 is in electrical contact with the n⁺-layer 4 of high carrier concentration. A photoresist 14 was deposited on the Ni layer 13. The photoresist 14 was then selectively etched off by photolithography leaving patterns of configuration (FIG.7) for the to-be-formed electrodes connected to the n⁺-layer 4 of high carrier concentration and the p-layer 63, respectively.

Using the photoresist 14 as a mask, the exposed part or area of the Ni layer 13 from the photoresist 14 was etched off by an etching liquid such as nitric acid. At this time, the nickel layer 13 that was laminated in the groove 9 was also removed completely. Then, the photoresist layer 14 was removed by a photoresist removal liquid such as acetone. Two electrodes were formed, the electrode 8 for the n⁺-layer 4 of high carrier concentration and the electrode 7 for the p-layer 63. The trench like groove 9 insulates the electrodes 7 and 8 from one another. A wafer treated with the above mentioned process was divided or diced into each chip or element which thus constituted a gallium nitride compound LED with a p-p-n junction structure as shown in FIG. 1.

The obtained LED 100 was found to have a luminous intensity of 1 cd and a wavelength of 430 nm at a driving current of 20 mA and a driving voltage of 4V.

Preferable impurity concentrations of Si and Cd doped into the emission layer 5 are in the range of $1 \times 10^{17}/cm^3$ to $1 \times 10^{20}/cm^3$, respectively, for higher luminous intensity. Further, the preferable concentration of Si is half to one-tenth as much as that of Cd.

In this embodiment, the LED 100 has a double-hetero junction structure sandwiching the emission layer 5 by the p-layer 61 and the n⁺-layer 4 which have wider band gaps than that of the emission layer 5. The composition ratio of Al, Ga, and In of the three layers are designed to match the lattice constant of the GaN n⁺-layer 3 of high carrier concentration.

EXAMPLE 2

Figure 8:
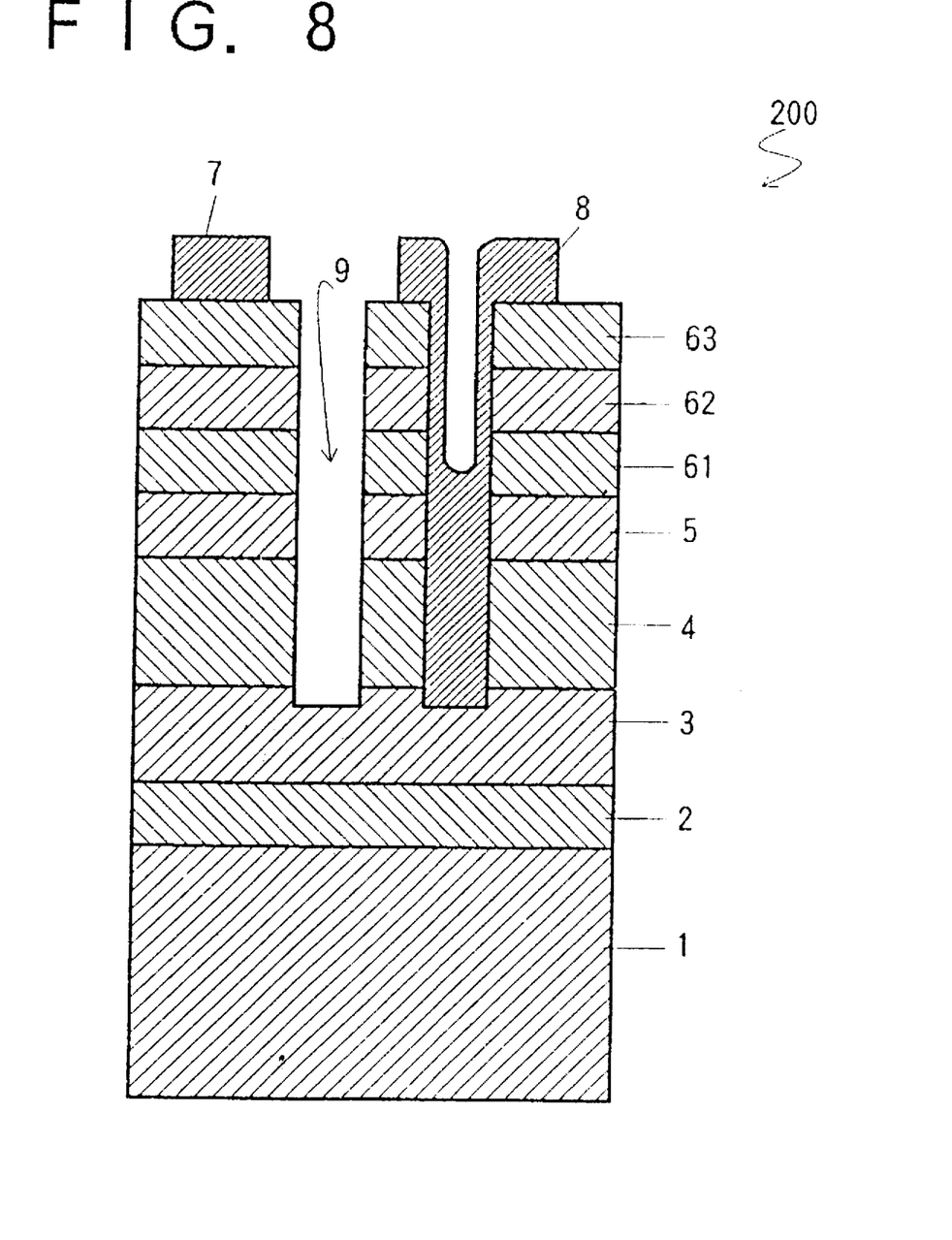
FIG. 8 is a diagram showing the structure of the LED in Example 2.

FIG. 8 shows a LED 200 in Example 2. The difference between the LED 100 in Example 1 and the LED 200 resides in the impurity doped into the emission layer 5. In Example 1, Mg, Cd, and Si are doped into the emission layer 5, and, in Example 2, Mg, Zn, and Si are doped.

The sapphire substrate 1 to the n⁺-layer 3 were prepared by the same methods that described in Example 1. On the n⁺-layer 3, about a 0.5 μm thick Si-doped $(Al_{0.3}Ga_{0.7})_{0.94}In_{0.06}N$ n⁺-layer 4 of high carrier concentration with an electron concentration of $2 \times 10^{19}/cm^3$ was formed under conditions of keeping the temperature of the sapphire substrate 1 at 800° C. and supplying $H_2$ at a flow rate of 20 liter/min., $NH_3$ at 10 liter/min., TMG at $1.12 \times 10^{-4}$ mol/min., TMA at $0.47 \times 10^{-4}$ mol/min., TMI at $0.1 \times 10^{-4}$ mol/min., and diluted silane to 0.86 ppm by $H_2$ at $1 \times 10^{-8}$ mol/min. for 60 min.

On the n⁺-layer 4, about a 0.5 μm thick Mg-, Si-, and Zn-doped $(Al_{0.09}Ga_{0.91})_{0.99}In_{0.01}N$ emission layer 5 was formed under conditions of keeping the temperature of the sapphire substrate 1 at 1150° C. and supplying $N_2$ at a flow rate of 20 liter/min., $NH_3$ at 10 liter/min., TMG at $1.53 \times 10^{-4}$ mol/min., TMA at $0.47 \times 10^{-4}$ mol/min., TMI $0.02 \times 10^{-4}$ mol/min., $CP_2Mg$ at $2 \times 10^{-4}$ mol/min., DEZ at $2 \times 10^{-4}$ mol/min., and diluted silane to 0.86 ppm by $H_2$ at $1 \times 10^{-8}$ mol/min. for 60 min. The impurity concentration of Mg, Zn, and Si doped into the emission layer 5 was $1 \times 10^{19}/cm^3$, $2 \times 10^{18}/cm^3$, and $1 \times 10^{18}/cm^3$, respectively.

On the emission layer 5, about a 1.0 μm thick Mg-doped $(Al_{0.3}Ga_{0.7})_{0.94}In_{0.06}N$ p-layer 61 was formed under conditions of keeping the temperature of the sapphire substrate 1 at 1100° C. and supplying $N_2$ at a flow rate of 20 liter/min., $NH_3$ at 10 liter/min., TMG at $1.12 \times 10^{-4}$ mol/min., TMA at $0.47 \times 10^{-4}$ mol/min., TMI at $0.1 \times 10^{-4}$ mol/min., and $CP_2Mg$ at $2 \times 10^{-4}$ mol/min. for 120 min. Resistivity of the p-layer 61 was $10^8$ Ω·cm or more exhibiting insulative characteristics. The impurity concentration of the Mg doped into the p-layer 61 was $1 \times 10^{20}/cm^3$.

On the p-layer 61, about a 2.0 μm thick Mg-doped GaN second contact layer 62 was formed under conditions of keeping the temperature of the sapphire substrate 1 at 850° C. and supplying $N_2$ or $H_2$ at a flow rate of 20 liter/min., $NH_3$ at 10 liter/min., TMG at $1.12 \times 10^{-4}$ mol/min., and $CP_2Mg$ at $2 \times 10^{-4}$ mol/min. for 30 min. Resistivity of the second contact layer 62 was $10^8$ Ω·cm or more exhibiting insulative characteristics. The impurity concentration of the Mg doped into the second contact layer 62 was $1 \times 10^{20}/cm^3$.

On the second contact layer 62, about a 500 Å thick Mg doped GaN first contact layer 63 was formed under conditions of keeping the temperature of the sapphire substrate 1 at 850° C. and supplying $N_2$ or $H_2$ at a flow rate of 20 liter/min., $NH_3$ at 10 liter/min., TMG at $1.12 \times 10^{-4}$ mol/min., and $CP_2Mg$ at $4 \times 10^{-4}$ mol/min. for 10 min. Resistivity of the first contact layer 63 was $10^8$ Ω·cm or more, exhibiting insulative characteristics. The impurity concentration of the Mg doped into the first contact layer 63 was $2 \times 10^{20}/cm^3$.

Then, electron rays were uniformly irradiated into the first contact layer 63, the second contact layer 62, the p-layer 61, and the emission layer 5 using a reflective electron beam diffraction device. The irradiation conditions were the same that described in Example 1. This irradiation changed each of the insulative first contact layer 63, second contact layer 62, p-layer 61, and emission layer 5 into a p-type conductive semiconductor. The obtained LED 200 was found to have a luminous intensity of 1 cd and a wavelength of 430 nm at a driving current of 20 mA and a driving voltage of 4V.

EXAMPLE 3

Figure 9:
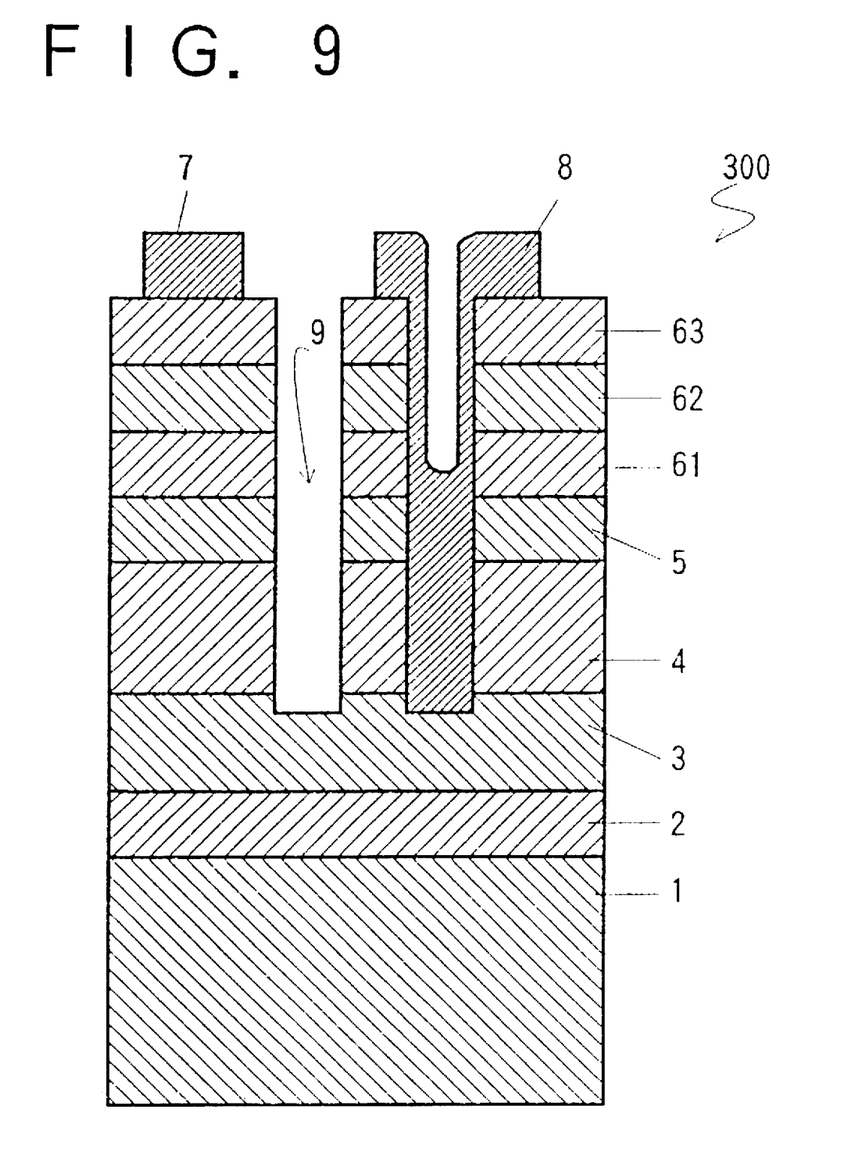
FIGS. 9 and 10 are diagrams showing the structure of the LED in Example 3.
Figure 10:
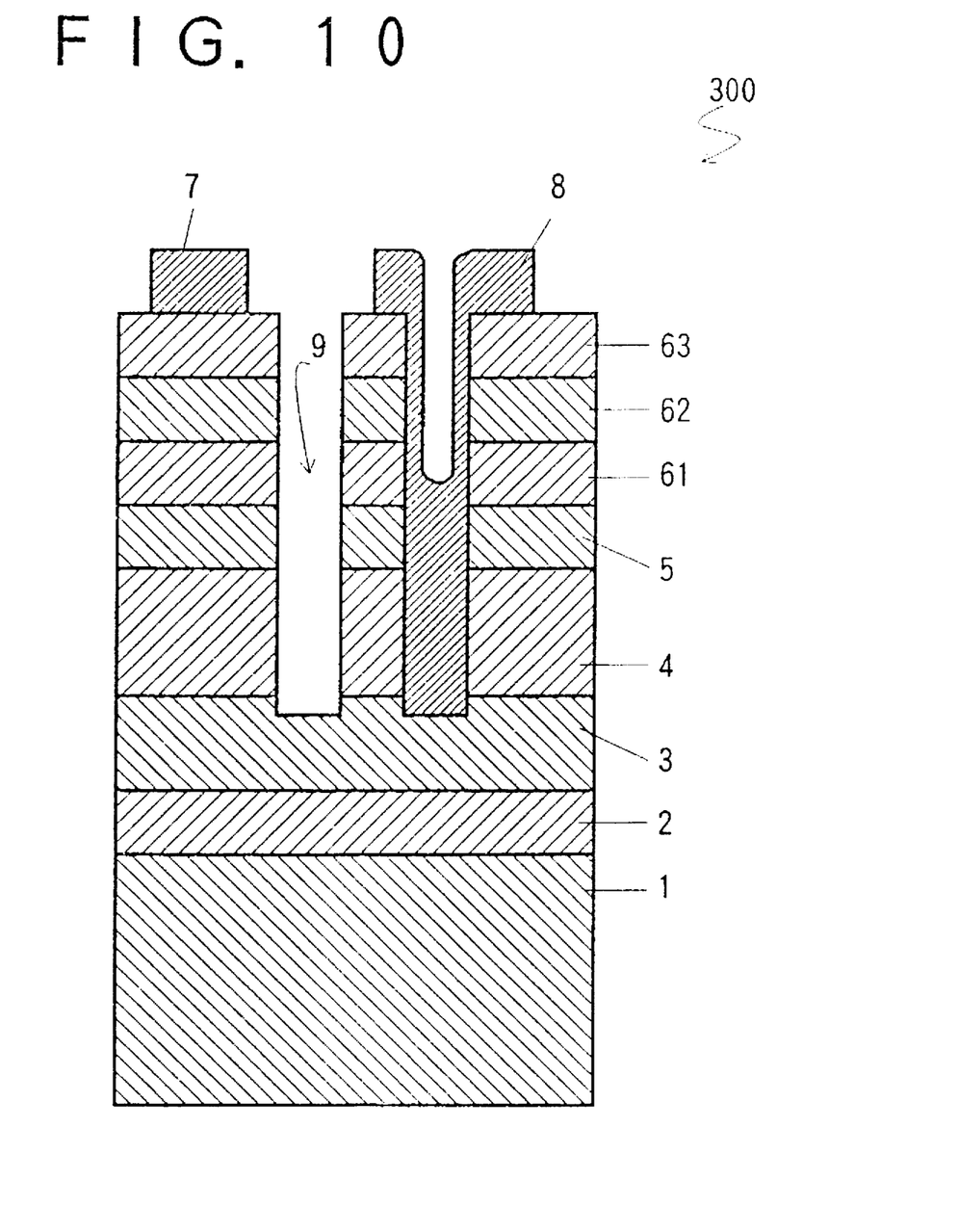

FIGS. 9 and 10 show a LED 300 in Example 3. The difference between the LED 200 in Example 2 and the LED 300 resides in the n$^+$-layer 4, the emission$^+$-layer 5, and the p-layer 61. In Example 3, the n$^+$-layer 4 of high carrier concentration is constituted by Si-doped Al$_{x2}$Ga$_{1-x2}$N, the emission layer 5 is by Mg-, Zn-, and Si-doped Ga$_y$In$_{1-y}$N, and the p-layer 61 is by Mg-doped Al$_{x1}$Ga$_{1-x1}$N. The composition ratio of x1, y, and x2 of the three layers are designed to form a double-hetero junction structure sandwiching the emission layer 5 by the n$^+$-layer 4 and the p-layer 61 which have a wider band gap than that of the emission layer 5. Other layers such as the first contact layer 62 and the second contact layer 63 are as same as those in Examples 1 and 2.

As shown in FIG. 10, the LED 300 has a sapphire (Al$_2$O$_3$) substrate 1 upon which the following seven layers are consecutively formed: an AlN buffer layer 2; a Si-doped GaN n$^+$-layer 3 of high carrier (n-type) concentration; a Si doped Al$_{0.1}$Ga$_{0.9}$N n$^+$-layer 4 of high carrier (n-type) concentration; Mg-, Zn-, and Si-doped Ga$_{0.94}$In$_{0.06}$N p-type emission layer 5; a Mg-doped Al$_{0.1}$Ga$_{0.9}$N p-layer 61; a Mg-doped GaN second contact layer 62; and a Mg-doped GaN first contact layer 63. The AlN layer 2 has a 500 Å thickness. The GaN n$^+$-layer 3 is about 2.0 μm in thickness and has a 2×10$^{18}$/cm$^3$ electron concentration. The n$^+$-layer 4 is about 4.0 μm in thickness and has a 2×10$^{18}$/cm$^3$ electron concentration. The emission layer 5 has about a 0.5 μm thickness. The p-layer 61 has about 0.5 μm thickness, a 5×10$^{17}$/cm$^3$ hole concentration, and a 1×10$^{19}$/cm$^3$ Mg concentration. The second contact layer 62 has about 0.2 μm thickness, a 5×10$^{17}$/cm$^3$ hole concentration, and a 1×10$^{20}$/cm$^3$ Mg concentration. The first contact layer 63 has a 500 Å thickness, a 2×10$^{17}$/cm$^3$ hole concentration, and a 2×10$^{20}$/cm$^3$ Mg concentration. Nickel electrodes 7 and 8 are connected to the first contact layer 63 and the n$^+$-layer 4, respectively. The electrodes 7 and 8 are electrically insulated by a groove 9.

A process of manufacturing the LED 300 is described hereinafter. The sapphire substrate 1, the AlN buffer layer 2 and, the n$^+$-layer 3 were prepared by the same way that was described in Example 1. On the n$^+$-layer 3, about a 4.0 μm thick Si-doped Al$_{0.1}$Ga$_{0.9}$N n$^+$-layer 4 of high carrier concentration with an electron concentration of 2×10$^{18}$/cm$^3$ was formed under conditions of keeping the temperature of the sapphire substrate 1 at 1150° C. and supplying N$_2$ or H$_2$ at a flow rate of 20 liter/min., NH$_3$ at 10 liter/min., TMG at 1.12×10$^{-4}$ mol/min., TMA at 0.47×10$^{-4}$ mol/min., and diluted silane to 0.86 ppm by H$_2$ at 10×10$^{-9}$ mol/min. for 60 min.

The following manufacturing process provides for an emission layer 5 as an active layer, a p-layer 61, a second contact layer 62, and a first contact layer 63 as clad layers; the LED 300 is designed to emit at a 450 nm wavelength peak in the luminous spectrum and has luminous centers of Zn and Si.

On the n$^+$-layer 4, about a 0.5 μm thick Mg-, Si-, and Zn-doped Ga$_{0.94}$In$_{0.06}$N emission layer 5 was formed under conditions of keeping the temperature of the sapphire substrate 1 at 850° C. and supplying N$_2$ at a flow rate of 20 liter/min., NH$_3$ at 10 liter/min., TMG at 1.53×10$^{-4}$ mol/min., TMI 0.02×10$^{-4}$ mol/min., CP$_2$Mg at 2×10$^{-4}$ mol/min., DEZ at 2×10$^{-7}$ mol/min., and diluted silane to 0.86 ppm by H$_2$ at 1×10$^{-8}$ mol/min. for 60 min. At this stage, the emission layer 5 exhibits high resistivity.

On the emission layer 5, about a 0.5 sum thick Mg-doped Al$_{0.1}$Ga$_{0.9}$N p-layer 61 was formed under conditions of keeping the temperature of the sapphire substrate 1 at 850° C. and supplying N$_2$ at a flow rate of 20 liter/min., NH$_3$ at 10 liter/min., TMG at 1.12×10$^{-4}$ mol/min., TMA at 0.47×10$^{-4}$ mol/min., and CP$_2$Mg at 2×10$^{-7}$ mol/min. for 60 min. Resistivity of the p-layer 61 was 10$^8$ Ω·cm or more, exhibiting insulative characteristics. The impurity concentration of Mg doped into the p-layer 61 was 1×10$^{19}$/cm$^3$.

On the p-layer 61, about a 0.5 μm thick Mg doped GaN second contact layer 62 was formed under conditions of keeping the temperature of the sapphire substrate 1 at 850° C. and supplying N$_2$ or H$_2$ at a flow rate of 20 liter/min., NH$_3$ at 10 liter/min., TMG at 1.12×10$^{-4}$ mol/min., and CP$_2$Mg at 2×10$^{-4}$ mol/min. for 30 min. Resistivity of the second contact layer 62 was 10$^8$ Ω·cm or more, exhibiting insulative characteristics. The impurity concentration of Mg doped into the second contact layer 62 was 1×10$^{20}$/cm$^3$.

On the second contact layer 62, about a 500 Å thick Mg-doped GaN first contact layer 63 was formed under conditions of keeping the temperature of the sapphire substrate 1 at 850° C. and supplying N$_2$ or H$_2$ at a flow rate of 20 liter/min., NH$_3$ at 10 liter/min., TMG at 1.12 ×10$^{-4}$ mol/min., and CP$_2$Mg at 4×10$^{-4}$ mol/min. for 10 min. The impurity concentration of Mg doped into the GaN layer 63 was 2×10$^{20}$/cm$^3$.

Then, electron rays were uniformly irradiated into the first contact layer 63, the second contact layer 62, the p-layer 61, and the emission layer 5 using a reflective electron beam diffraction device. The irradiation conditions were the same as those described in Example 1. This irradiation changed the insulative first contact layer 63, second contact layer 62, p-layer 61, and emission layer 5 into a p-type conductive semiconductor with a hole concentration of 2×10$^{17}$/cm$^3$, 5×10$^{17}$/cm$^3$, and 5×10$^{17}$/cm$^3$, and 5×10$^{17}$/cm$^3$, and a resistivity of 2 Ω·cm, 0.8 Ω·cm, 0.8 Ω·cm, and 0.8 Ω·cm, respectively.

When the electrode area was 6×10$^{-4}$ cm$^2$, the driving voltage was 4 V at a 20 mA current and the contact resistance was 30 to 40 μ. When the electrode area was 1.6×10$^{-3}$ cm$^2$, the driving voltage was 3.5 V at a 20 mA current and the contact resistance was 10 to 15 Ω.

Figure 11:
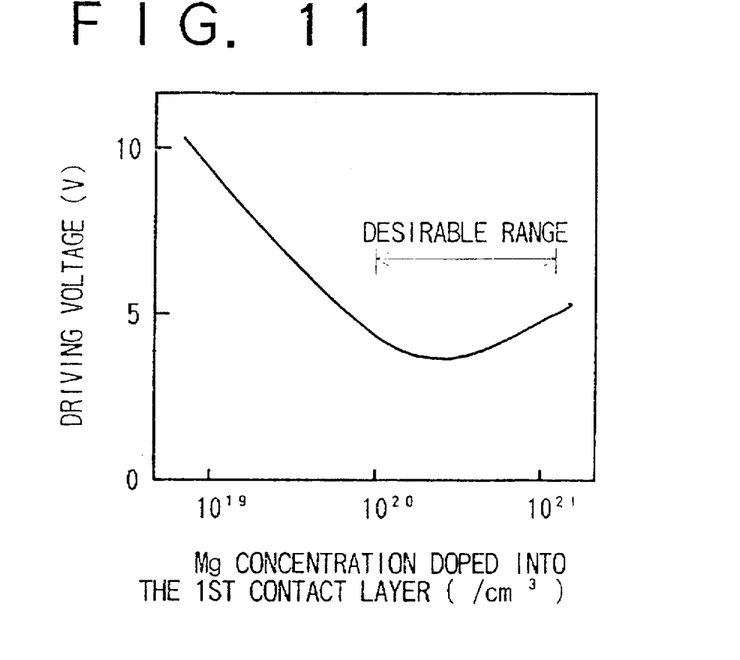
FIG. 11 is a graph showing the relationship between driving voltage and Mg concentration doped into the first contact layer.

FIG. 11 shows the relationship between the device driving voltage at a 20 mA electric current (ordinate) and the Mg concentration doped into the first contact layer 63 (abscissa). The Mg concentration was altered from 1×10$^{19}$/cm$^3$ to 2×10$^{21}$/cm$^3$. Accordingly, the driving voltage varied in the 11.2 V to 4.0 V range and contact resistance between the electrode 7 and the first contact layer 63 varied in the range of 250 to 30 Ω. When the Mg concentration was 2×10$^{20}$/cm$^3$, the driving voltage exhibited the minimum 4.0 V and the contact resistance exhibited the minimum 30 Ω. When the Mg concentration was 2×0$^{21}$2/cm$^3$, the driving voltage increased up to 5.0 V and the contact resistance increased to 70 Ω. Therefore, the desirable range of the Mg concentration doped into the first contact layer 63 was found to be in the range of 1×10$^{20}$/cm$^3$ to 1×10$^{21}$/cm$^3$ in order to decrease the driving voltage to 5 V or lower.

Figure 12:
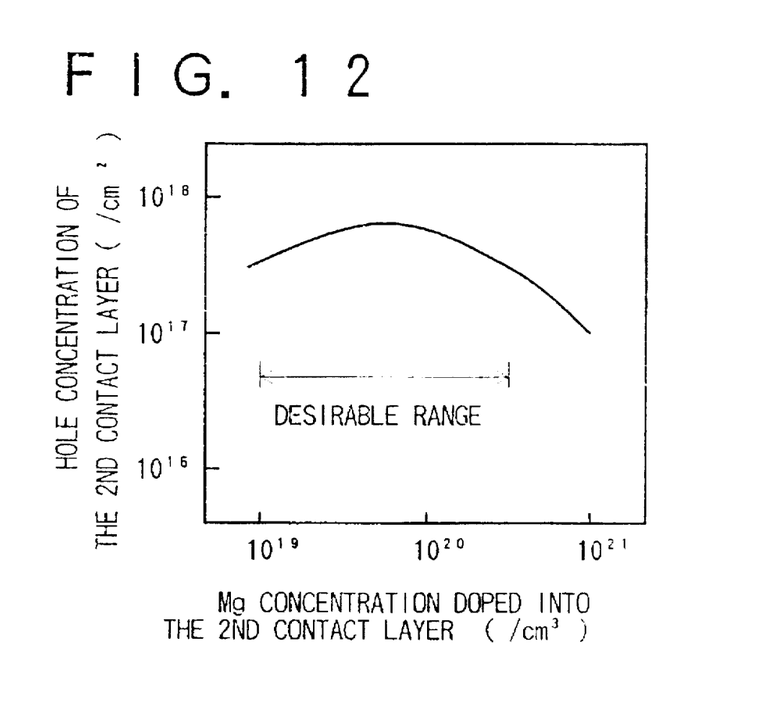
FIG. 12 is a graph showing the relationship between hole concentration of the second contact layer or the p-layer and Mg concentration doped into the second contact layer or the p-layer.

FIG. 12 shows the relationship between the hole concentration of the second contact layer 62 or the p-layer 61 (ordinate) and the Mg concentration (abscissa) doped into the second contact layer 62 or the p-layer 61. When the Mg concentration was increased to 5×10$^{19}$/cm$^3$, the hole concentration increased and saturated at the concentration of 7×10$^{17}$/cm$^3$. Further increase of Mg concentration decreased the hole concentration and the luminous efficiency. Therefore, it is preferable to dope Mg into the second contact layer 62 or the p-layer 61 in the range of 1×10$^{19}$/cm$^3$ to 5×10$^{20}$/cm$^3$ and to keep the Mg concentration of the layer 62 or 61 lower than that of the first contact layer 63, because of the increased hole concentration of the second contact layer 62 and the improved luminous efficiency of the LED 300.

In Examples 1 to 3, the preferable concentration of Zn and Si doped into the emission layer 5 was found to range from $1 \times 10^{17}/cm^3$ to $1 \times 10^{20}/cm^3$ for improved luminous intensity, respectively. Further the preferable concentration of Zn and Si ranges from $1 \times 10^{18}/cm^3$ to $1 \times 10^{19}/cm^3$, respectively. When the impurity concentration is $1 \times 10^{18}/cm^3$ or lower, the doping impurities have little effect on luminous intensity. When the impurity concentration is $1 \times 10^{19}/cm^3$ or higher, the crystallinity of the emission layer becomes poor. The preferable concentration of Si is one tenth to ten times as much as that of Zn. A more preferable concentration range of Si is one tenth to one as much as that of Zn.

In Examples 1 to 3, the contact layer had a double layer structure constituted by the first contact layer 63 heavily doped with Mg and the second contact layer 62 doped with a low Mg concentration relative to that of the first contact layer 63. Alternatively, only a contact layer which is doped with Mg more heavily than the emission layer 5 of p-type can be formed beneath the electrodes 7 and 8. GaN was utilized as the material for the contact layers 62 and 63. Alternatively, materials with the same composition ratio as the emission layer 5 can be used.

In Examples 1 to 3, Cd and Mg or Zn and Mg were employed as acceptor impurities and Si as a donor impurity. Alternatively, beryllium (Be) and mercury (Hg) can be used as an acceptor impurity and carbon (C), germanium (Ge), tin (Sn), lead (Pb), sulfur (S), selenium (Se), and tellurium (Te) can be used as a donor impurity.

Heat annealing, heat treatment in an atmosphere of $N_2$ gases, or laser irradiation can be used as an alternative to electron irradiation to obtain p-type conduction.

While the invention has been described in connection with what are presently considered to be the most practical and preferred exemplary embodiments, it is to be understood that the invention is not to be limited to the disclosed exemplary embodiments, but on the contrary, is intended to cover various modifications and equivalent arrangements included within the spirit and scope of the appended claims.

What is claimed is:

1. A light-emitting semiconductor device comprising:
   a hetero junction structure including:
   an n-layer having n-type conduction and a Group III nitride compound semiconductor satisfying the formula $Al_{x1}Ga_{y1}In_{1-x1-y1}N$, wherein $0 \leq x1 \leq 1$, $0 \leq y1 \leq 1$, and $0 \leq x1+y1 \leq 1$,
   a p-layer having p-type conduction and a Group III nitride compound satisfying the formula $Al_{x3}Ga_{y3}In_{1-x3-y3}N$ wherein $0 \leq x3 \leq 1$, $0 \leq y3 \leq 1$, and $0 \leq x3+y3 \leq 1$, and
   an emission layer formed between said n-layer and said p-layer, said emission layer comprising a Group III nitride compound satisfying the formula $Al_{x2}Ga_{y2}In_{1-x2-y2}N$, wherein $0 \leq x2 \leq 1$, $0 \leq y2 \leq 1$, and $0 \leq x2+y2 \leq 1$;
   a metal electrode formed on said p-layer; and
   wherein said p-layer has at least a double layer structure having a first p-layer satisfying the formula $Al_{x4}Ga_{y4}In_{1-x4-y4}N$ wherein $0 \leq x4 \leq 1$, $0 \leq y4 \leq 1$, and $0 \leq x4+y4 \leq 1$ and a second p-layer satisfying the formula $Al_{x5}Ga_{y5}In_{1-x5-y5}N$ wherein $0 \leq x5 \leq 1$, $0 \leq y5 \leq 1$, and $0 \leq x5+y5 \leq 1$, wherein said first p-layer is doped with an acceptor impurity in concentration nearly equal to an impurity concentration that makes maximum hole concentration, and wherein said second p-layer is formed on said first p-layer in direct contact with said metal electrode and is doped with an acceptor impurity in concentration nearly equal to an impurity concentration that makes minimum driving voltage of said device.

2. A light-emitting semiconductor device according to claim 1, wherein said acceptor impurity doped into said first p-layer is magnesium and wherein said impurity concentration that makes maximum hole concentration is about $5 \times 10^{19}/cm^3$.

3. A light-emitting semiconductor device according to claim 1, wherein said acceptor impurity doped into said second p-layer is magnesium and wherein said impurity concentration that makes minimum driving voltage is about $2 \times 10^{20}/cm^3$.

4. A light-emitting semiconductor device according to claim 1, wherein said second p-layer is gallium nitride.

5. A light-emitting semiconductor device according to claim 1, wherein a third p-layer satisfying the formula $Al_{x6}Ga_{y6}In_{1-x6-y6}N$ wherein $0 \leq x6 \leq 1$, $0 \leq y6 \leq 1$, and $0 \leq x6+y6 \leq 1$ is formed between said emission layer and said first p-layer.

6. A light-emitting semiconductor device according to claim 1, wherein said first p-layer is $Ga_{y5}In_{1-y5}N$.

7. A light-emitting semiconductor device according to claim 5, wherein said third p-layer is $Al_{x6}Ga_{1-x6}N$.

8. A light-emitting semiconductor device according to claim 5, wherein said metal electrode comprises one of nickel and an alloy including nickel.

9. A light-emitting semiconductor device according to claim 1, wherein said metal electrode comprises one of nickel and an alloy including nickel.

10. A light-emitting semiconductor device according to claim 1, wherein said first p-layer is $Al_{x4}Ga_{1-x5}N$ and is formed on said emission layer.

11. A light-emitting semiconductor device according to claim 1, wherein concentration of said acceptor impurity doped into said first p-layer is lower than a selected concentration that is in between the concentration that makes maximum hole concentration and the concentration that makes minimum driving voltage of said device and wherein concentration of said acceptor impurity doped into said second p-layer is at least equal to said selected concentration.

12. A light-emitting semiconductor device according to claim 11, wherein said acceptor impurity doped into said first and second p-layers is magnesium.

13. A light-emitting semiconductor device according to claim 12, wherein said selected concentration is $1 \times 10^{20}/cm^3$.

14. A light-emitting semiconductor device according to claim 12, wherein magnesium concentration doped into said first p-layer is in the range of about $1 \times 10^{19}/cm^3$ to about said selected concentration and magnesium concentration doped into said second p-layer is in the range of about said selected concentration to about $1 \times 10^{21}/cm^3$.

15. A light-emitting semiconductor device according to claim 12, wherein magnesium concentration doped into said first p-layer is in the range of about $1 \times 10^{19}/cm^3$ to about $1 \times 10^{20}/cm^3$ and magnesium concentration doped into said second p-layer is in the range of about $1 \times 10^{20}/cm^3$ to about $1 \times 10^{21}/cm^3$.

16. A light-emitting semiconductor device according to claim 1, wherein said acceptor impurity doped into said first p-layer is magnesium and wherein said impurity concentration that makes maximum hole concentration is in the range from about $1 \times 10^{19}/cm^3$ to about $5 \times 10^{20}/cm^3$.

17. A light-emitting semiconductor device according to claim 1, wherein said acceptor impurity doped into said second p-layer is magnesium and wherein said impurity concentration that makes minimum driving voltage is in the range of about $1 \times 10^{20}/cm^3$ to about $1 \times 10^{21}/cm^3$.

18. A light-emitting semiconductor device comprising:
    a hetero junction structure including:

an n-layer having n-type conduction and a Group III nitride compound semiconductor satisfying the formula $Al_{x1}Ga_{y1}In_{1-x1-y1}N$, wherein $0 \leq x1 \leq 1$, $0 \leq y1 \leq 1$, and $0 \leq x1+y \leq 1$, a p-layer having p-type conduction and a Group III nitride compound satisfying the formula $Al_{x3}Ga_{y3}In_{1-x3-y3}N$, wherein $0 \leq x3 \leq 1$, $0 \leq y3 \leq 1$, and $0 \leq x3+y3 \leq 1$, and an emission layer of a Group III nitride compound satisfying the formula $Al_{x2}Ga_{y2}In_{1-x2-y2}N$, wherein $0 \leq x2 \leq 1$, $0 \leq y2 \leq 1$, and $0 \leq x2+y2 \leq 1$ and being formed between said n-layer and said n-layer and said p-layer;

a contact layer having p-type conduction and a Group III nitride compound satisfying the formula $Al_{x4}Ga_{y4}In_{1-x4-y4}N$, wherein $0 \leq x4 \leq 1$, $0 \leq y4 \leq 1$, and $0 \leq x4+y4 \leq 1$, said contact layer being formed on said p-layer;

a metal electrode formed in direct contact with said contact layer; and wherein said contact layer is doped with an acceptor impurity in concentration more heavily than an impurity concentration that makes maximum hole concentration.

19. A light-emitting semiconductor device according to claim 18, wherein said acceptor impurity doped into said contact layer is magnesium and wherein said impurity concentration that makes maximum hole concentration is about $5 \times 10^{20}/cm^3$.

20. A light-emitting semiconductor device according to claim 18, wherein said contact layer is gallium nitride.

21. A light-emitting semiconductor device according to claim 18, wherein said contact layer is $Ga_{y4}In_{1-y4}N$.

22. A light-emitting semiconductor device according to claim 18, wherein said metal electrode comprises one of nickel and an alloy including nickel.

23. A light-emitting semiconductor device comprising:

a hetero junction structure including:

an n-layer having n-type conduction and a Group III nitride compound semiconductor satisfying the formula $Al_{x1}Ga_{y1}In_{1-x1-y1}N$, wherein $0 \leq x1 \leq 1$, $0 \leq y1 \leq 1$, and $0 \leq x1+y1+1$, a p-layer having p-type conduction and a Group III nitride compound satisfying the formula $Al_{x3}Ga_{y3}In_{1-x3-y3}N$, wherein $0 \leq x3 \leq 1$, $0 \leq y3 \leq 1$, and $0 \leq x3+y3 \leq 1$, and an emission layer of a Group III nitride compound satisfying the formula $Al_{x2}Ga_{y2}In_{1-x2-y2}N$, wherein $0 \leq x2 \leq 1$, $0 \leq y2 \leq 1$, and $0 \leq x2+y2 \leq 1$ and being formed between said n-layer and said p-layer;

a contact layer having p-type conduction and a Group III nitride compound satisfying the formula $Al_{x4}Ga_{y4}In_{1-x4-y4}N$ wherein $0 \leq x4 \leq 1$, $0 \leq y4 \leq 1$, and $0 \leq x4+y4 \leq 1$, said contact layer being formed on said p-layer;

an electrode formed in direct contact in said contact layer; and wherein said contact layer is doped with an acceptor impurity in concentration nearly equal to an impurity concentration that makes minimum driving voltage of said device.

24. A light-emitting semiconductor device according to claim 23, wherein said acceptor impurity doped into said contact layer is magnesium and wherein said impurity concentration that makes minimum driving voltage is $2 \times 10^{20}/cm^3$.

25. A light-emitting semiconductor device according to claim 23, wherein said contact layer is gallium nitride.

26. A light-emitting semiconductor device according to claim 23, wherein said contact layer is $Ga_{y4}In_{1-y4}N$.

27. A light-emitting semiconductor device according to claim 23, wherein said metal electrode comprises one of nickel and an alloy including nickel.

28. A light-emitting semiconductor device comprising:

a hetero junction including:

an n-layer having n-type conduction and a Group III nitride compound semiconductor satisfying the formula $Al_{x1}Ga_{y1}In_{1-x1-y1}N$, wherein $0 \leq y1 \leq 1$, $0 \leq x1 \leq 1$, and $0 \leq x1+y1 \leq 1$, a p-layer having p-type conduction and a Group III nitride compound satisfying the formula $Al_{x3}Ga_{y3}In_{1-x3-y3}N$, wherein $0 \leq x3 \leq 1$, $0 \leq y3 \leq 1$, and $0 \leq x3+y3 \leq 1$, and an emission layer of a Group III nitride compound satisfying the formula $Al_{x2}Ga_{y2}In_{1-x2-y2}N$, wherein $0 \leq x2 \leq 1$, $0 \leq y2 \leq 1$, and $0 \leq x2+y2 \leq 1$ and being formed between said n-layer and said p-layer, a contact layer having p-type conduction formed on said p-layer and a Group III nitride compound satisfying the formula $Al_{x4}Gs_{y4}In_{1-x4-y4}N$, wherein $0 \leq x4 \leq 1$, $0 \leq y4 \leq 1$, and $0 \leq x4+y4 \leq 1$;

a metal electrode formed in direct contact with said contact layer; and wherein said contact layer has a double layer structure having a first contact layer satisfying the formula $Al_{x5}Ga_{y5}In_{1-x5-y5}N$, wherein $0 \leq x5 \leq 1$, $0 \leq y5 \leq 1$, and $0 \leq x5+y5 \leq 1$ and a second contact layer satisfying the formula $Al_{x6}Ga_{y6}In_{1-x6-y6}N$, where $0 \leq x6 \leq 1$, $0 \leq y6 \leq 1$, and $0 \leq x6+y6 \leq 1$, wherein said first contact layer is formed on said second contact layer in direct contact with said metal electrode and is doped with magnesium in the range of about $1 \times 10^{20}/cm^3$ to about $1 \times 10^{21}/cm^3$, and wherein said second contact layer is formed on said p-layer and is doped more lightly than said first contact layer with magnesium in the range of about $1 \times 10^{19}/cm^3$ to about $5 \times 10^{20}/cm^3$.

29. A light-emitting semiconductor device according to claim 28, wherein said contact layer is gallium nitride.

30. A light-emitting semiconductor device according to claim 28, wherein said first contact layer is $Ga_{y5}In_{1-y5}N$ and said second contact layer is $Ga_{y6}In_{1-y6}N$.

31. A light-emitting semiconductor device according to claim 28, wherein said p-layer is $Al_{x3}Ga_{1-x3}N$.

32. A light-emitting semiconductor device according to claim 28, wherein said first contact layer has lower carrier concentration than said second contact layer.

\* \* \* \* \*

UNITED STATES PATENT AND TRADEMARK OFFICE
CERTIFICATE OF CORRECTION

PATENT NO. : 5,753,939
DATED : May 19, 1998
INVENTOR(S) : Sassa et al.

It is certified that error appears in the above-identified patent and that said Letters Patent is hereby corrected as shown below:

Title page:

--[73] Assignee: TOYODA GOSEI CO., LTD.
Aichi-ken, Japan--

Column 10, line 18, change "claim 1" to --claim 5--; and delete "$Ga_{y5}In_{1-y5}N$" and insert --$Ga_{y4}In_{1-y4}N$ and second p-layer is $Ga_{y5}In_{1-y5}N$--; and
line 37, delete "is at least equal to" and insert --is higher than--.

Column 11, line 28, change "$5 \times 10^{20}/cm^3$" to --$5 \times 10^{19}/cm^3$--.

Column 12, line 30, change "$Al_{x4}Gs_{y4}In_{1-x4-y4}N$" and insert --$Al_{x4}Ga_{y4}In_{1-x4-y4}N$--.

Signed and Sealed this

Sixteenth Day of May, 2000

Attest:

Q. TODD DICKINSON

*Attesting Officer*  *Director of Patents and Trademarks*

UNITED STATES PATENT AND TRADEMARK OFFICE
CERTIFICATE OF CORRECTION

PATENT NO. : 5,753,939
DATED : May 19, 1998
INVENTOR(S) : SASSA et al

It is certified that error appears in the above-identified patent and that said Letters Patent is hereby corrected as shown below:

On the title page:

Delete "[73] Assignee: TOYODA GOSEI CO., LTD.
Aichi-ken, Japan"

in the first Certificate of Correction and insert therefor

--[73] Assignees: TOYODA GOSEI CO., LTD.; KABUSHIKI KAISHA
TOYOTA CHUO KENKYUSHO, both of Aichi-ken, Japan--.

Column 10, line 28, delete "$Al_{x4}Ga_{1-x5}N$" and insert therefor --$Ga_{x4}In_{1-x4}N$--.

Delete "$Ga_{x4}In_{1-x4}N$" in the Second Certificate of Correction (Col. 10, line 28 of the above-identified patent) and insert therefor --$Al_{x4}Ga_{1-x4}N$--.

Signed and Sealed this

Thirty-first Day of October, 2000

Attest:

Q. TODD DICKINSON

*Attesting Officer*       *Director of Patents and Trademarks*

UNITED STATES PATENT AND TRADEMARK OFFICE
CERTIFICATE OF CORRECTION

PATENT NO. : 5,753,939
DATED : May 19, 1998
INVENTOR(S) : Sassa et al.

It is certified that error appears in the above-identified patent and that said Letters Patent is hereby corrected as shown below:

Column 9,
Line 47, change "$Al_{x3}Ga_{y3}In_{1-3x-y3}N$" to -- $Al_{x3}Ga_{y3}In_{1-x3-y3}N$ --.

Column 11,
Line 4, change "$0 \leqq x1+y \leqq 1$" to -- $0 \leqq x1+y1 \leqq 1$ --.
Line 42, change "$0 \leqq x1+y1+1$" to -- $0 \leqq x1+y1 \leqq 1$ --.

Signed and Sealed this

Eighteenth Day of March, 2003

JAMES E. ROGAN
*Director of the United States Patent and Trademark Office*